(12) United States Patent
Shen et al.

(10) Patent No.: US 9,373,564 B2
(45) Date of Patent: Jun. 21, 2016

(54) SEMICONDUCTOR DEVICE, MANUFACTURING METHOD AND STACKING STRUCTURE THEREOF

(71) Applicant: Industrial Technology Research Institute, Hsinchu (TW)

(72) Inventors: Wen-Wei Shen, Hsinchu (TW); Kuan-Neng Chen, Hsinchu (TW); Cheng-Ta Ko, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/640,028

(22) Filed: Mar. 6, 2015

(65) Prior Publication Data
US 2016/0043018 A1 Feb. 11, 2016

Related U.S. Application Data

(60) Provisional application No. 62/034,157, filed on Aug. 7, 2014.

(30) Foreign Application Priority Data

Dec. 5, 2014 (TW) .............................. 103142418 A

(51) Int. Cl.
*H01L 29/40* (2006.01)
*H01L 23/48* (2006.01)
(Continued)

(52) U.S. Cl.
CPC ........ *H01L 23/481* (2013.01); *H01L 21/76898* (2013.01); *H01L 25/0657* (2013.01); *H01L 2225/06541* (2013.01)

(58) Field of Classification Search
CPC ................... H01L 21/02063; H01L 23/49827; H01L 23/5384
See application file for complete search history.

(56) References Cited

U.S. PATENT DOCUMENTS

| 8,399,987 B2 | 3/2013 | Kwon et al. |
| 8,456,017 B2 | 6/2013 | Dai et al. |

(Continued)

FOREIGN PATENT DOCUMENTS

| CN | 102074545 | 5/2011 |
| CN | 102800633 | 11/2012 |

(Continued)

OTHER PUBLICATIONS

Cheng-Ta Ko, et al., "A Wafer-Level Three-Dimensional Integration Scheme With Cu TSVs Based on Microbump/Adhesive Hybrid Bonding for Three-Dimensional Memory Application," IEEE Transactions on Device and Materials Reliability, vol. 12, No. 2, Jun. 2012, pp. 209-pp. 216.

(Continued)

*Primary Examiner* — Elias M Ullah
(74) *Attorney, Agent, or Firm* — Jianq Chyun IP Office

(57) ABSTRACT

A semiconductor device includes a substrate, a redistribution layer, a plurality of through-silicon vias (TSVs), and a plating seed layer. The substrate has a first surface and a second surface opposite to each other, and a plurality of cavities. The redistribution layer is disposed on the first surface, and the TSVs are respectively disposed in the cavities. The plating seed layer is disposed between the inner wall of each of the cavities and the corresponding TSVs. The anti-oxidation layer is disposed between the plating seed layer and the corresponding TSVs. The buffer layer covers the first surface and exposes the redistribution layers. Furthermore, a manufacturing method and a stacking structure of the semiconductor device are also provided.

11 Claims, 16 Drawing Sheets

(51) Int. Cl.
*H01L 21/768* (2006.01)
*H01L 25/065* (2006.01)

(56) References Cited

U.S. PATENT DOCUMENTS

| | | | |
|---|---|---|---|
| 8,592,311 | B2 | 11/2013 | Lin et al. |
| 8,691,691 | B2 | 4/2014 | Farooq et al. |
| 2005/0136634 | A1 | 6/2005 | Savastiouk et al. |
| 2006/0043599 | A1 | 3/2006 | Akram et al. |
| 2011/0291153 | A1* | 12/2011 | Yang ............... H01L 33/486 257/99 |
| 2013/0037944 | A1* | 2/2013 | Lee ................. H01L 25/0657 257/737 |
| 2013/0285244 | A1 | 10/2013 | Lin et al. |
| 2013/0320505 | A1* | 12/2013 | Emesh ............ H01L 21/76882 257/621 |

FOREIGN PATENT DOCUMENTS

| | | |
|---|---|---|
| TW | 200425464 | 11/2004 |
| TW | I415244 | 11/2013 |
| TW | 201405755 | 2/2014 |

OTHER PUBLICATIONS

Yao-Jen Chang, et al., "Electrical and Reliability Investigation of Cu TSVs with Low-Temperature Cu/Sn and BCB Hybrid Bond Scheme," IEEE Electron Device Letters, vol. 34, No. 1, Jan. 2013, pp. 102-pp. 104.

Cheng-Ta Ko, et al., "Wafer-level bonding/stacking technology for 3D integration," Microelectronics Reliability, vol. 50, Issue 4, Apr. 2010, pp. 481-pp. 488.

Takafumi Fukushima, et al., "New Three-Dimensional Integration Technology Using Self-Assembly Technique," 2005. IEDM Technical Digest. IEEE International Electron Devices Meeting, Dec. 5, 2005, pp. 348-pp. 351.

Jian-Qiang Lu, "3-D Hyperintegration and Packaging Technologies for Micro-Nano Systems," Proceedings of the IEEE, vol. 97, No. 1, Jan. 2009, pp. 18-pp. 30.

Shag-Ping Shen, et al., "A Novel Cu Plating Formula for Filling Through Silicon Vias," 2009. IMPACT 2009. 4th International Microsystems, Packaging, Assembly and Circuits Technology Conference, Oct. 21-23, 2009, pp. 186-pp. 189.

H. H. Chang, et al., "TSV Process Using Bottom-up Cu Electroplating and its Reliability Test," 2008. ESTC 2008. 2nd Electronics System—Integration Technology Conference, Sep. 1-4, 2008, pp. 645-pp. 650.

Aibin Yu, et al., "Fabrication of High Aspect Ratio TSV and Assembly with Fine-Pitch Low-Cost Solder Microbump for Si Interposer Technology with High-Density Interconnects," IEEE Transactions on Components, Packaging and Manufacturing Technology, vol. 1, No. 9, Sep. 2011, pp. 1336-pp. 1344.

Cyrille Laviron, et al., "Via First Approach Optimisation for Through Silicon Via Applications," 2009. ECTC 2009. 59th Electronic Components and Technology Conference, May 26-29, 2009, pp. 14-pp. 19.

Ching-Kuan Lee, et al., "Characterization and Reliability Assessment of Solder Microbumps and Assembly for 3D IC Integration," 2011 IEEE 61st Electronic Components and Technology Conference (ECTC), May 31, 2011-Jun. 3 2011, pp. 1468-pp. 1474.

"Office Action of Taiwan Counterpart Application", issued on Apr. 12, 2016, p. 1-p. 9, in which the listed references were cited.

* cited by examiner

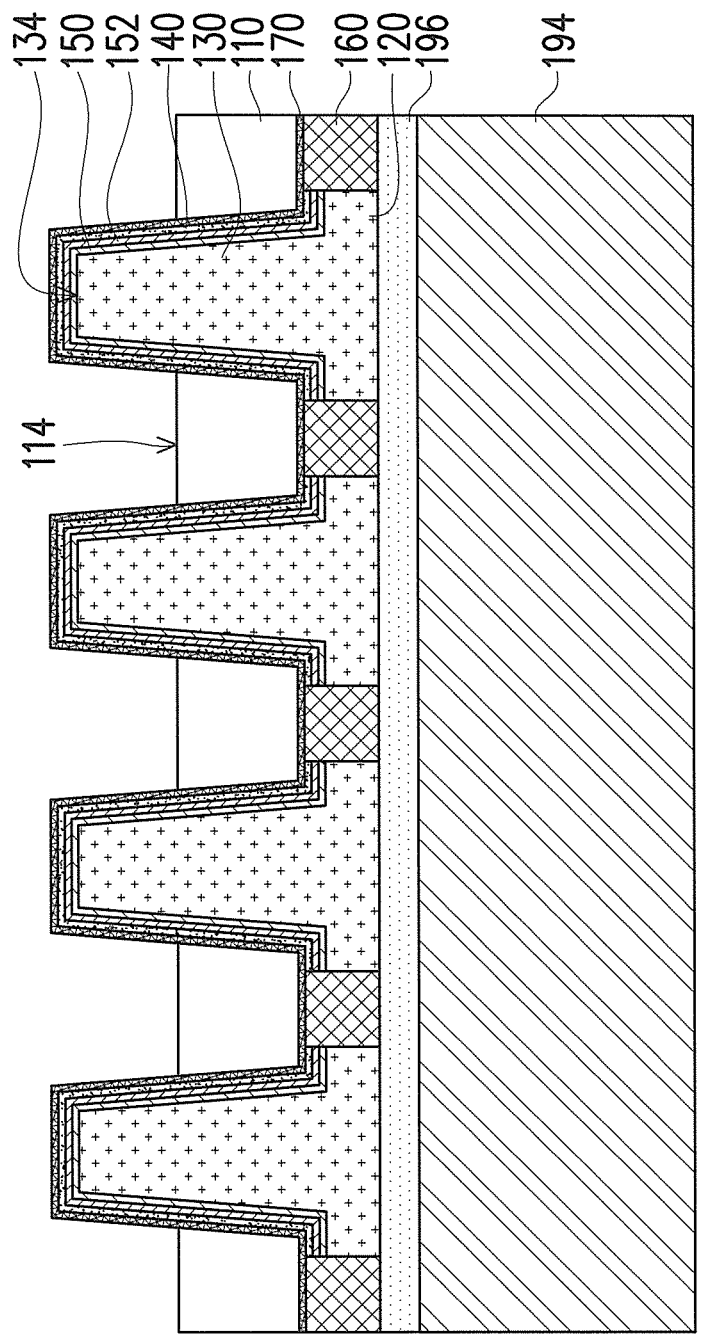

SEMICONDUCTOR DEVICE, MANUFACTURING METHOD AND STACKING STRUCTURE THEREOF

CROSS-REFERENCE TO RELATED APPLICATION

This application claims the priority benefits of U.S. provisional application Ser. No. 62/034,157, filed on Aug. 7, 2014 and Taiwan application serial no. 103142418, filed on Dec. 5, 2014. The entirety of each of the above-mentioned patent applications is hereby incorporated by reference herein and made a part of this specification.

TECHNICAL FIELD

The disclosure relates to a through-silicon via semiconductor device, the manufacturing method and the stacking structure thereof.

BACKGROUND

As the industry for integrated circuits and semiconductors develops, the integration density of various manufactured electronic components continues to increase. Integration density is advanced through decreasing a minimum feature size, so that more components can be integrated onto a limited area of a chip. Even though photolithography on a two dimensional integrated circuit already has remarkable developments, however, two dimensional integrated circuits has physical restrictions that limit the achievable component circuit density. As the number of components increases, the interconnection wiring between the components also increases. When the length and amount of interconnection wiring increases, the RC delay and the power consumption of the circuit noticeably escalates. Thus, the electronic components need a new structure and technology such as a three dimensional integrated circuit (3DIC) to improve the aforementioned circumstances. In the current semiconductor industry, 3DIC technology stacks chips vertically and utilizes through-silicon vias (TSVs) to connect its signals. This will effectively reduce the distance of conductive lines between chips, shrink the size of devices, and increase operating speed.

Three dimensional integrated circuits utilize TSVs to connect the high density vertical staking between integrated circuits, so that a distance between two chips is only tens of microns. More specifically, as bump package technology is developed as more precise, smaller distance between solder balls signifies that the connecting surface area of each solder ball is smaller. Thus, contrasted to adopting a large solder ball where there is more spatial flexibility, the challenges toward testing a reliable product with a three dimensional integrated circuit with smaller solder balls is more and more difficult. The aforementioned circumstances have also caused the cost of manufacturing three dimensional integrated circuits to be remarkably high. The electroplate manufacturing of TSVs has occupied a large portion of manufacturing costs.

SUMMARY

The disclosure provides a semiconductor device, including through-silicon vias, so as to electrically connect signals in a semiconductor apparatus.

The disclosure provides a method of manufacturing a semiconductor device that utilizes a single step of through-silicon via electroplating to simultaneously form a redistribution layer, through-silicon vias, and micro bumps.

The disclosure provides a semiconductor device stacking structure, including a plurality of semiconductor devices vertically stacked on a substrate. Multiple connecting elements are used to electrically connect the semiconductor devices.

An embodiment of the disclosure provides a semiconductor device including a substrate, a redistribution layer, a plurality of through-silicon vias (TSVs), a plating seed layer, an anti-oxidation layer, and a buffer layer. The substrate includes a first surface and a second surface opposite to each other, and a plurality of cavities. The cavities respectively connect the first surface and the second surface. In addition, the redistribution layer is disposed on the first surface. Furthermore, the TSVs are respectively disposed in the cavities, and include a first end and a second end opposite to each other. The first end of each TSV is connected to the redistribution layer, and the second end protrudes from the second surface. The plating seed layer is disposed between an inner wall of each of the cavities and the corresponding TSVs. In addition, the anti-oxidation layer is disposed between the plating seed layer and the corresponding TSVs, and covers the second ends of the corresponding TSVs. In addition, the buffer layer covers the first surface and exposes the redistribution layer. The redistribution layer further includes a third surface, and the buffer layer includes a fourth surface. The third surface and the fourth surface are coplanar to each other.

An embodiment of the disclosure provides a manufacturing method for a semiconductor device, including providing a substrate. The substrate includes a first surface and a plurality of cavities. Next, a plating seed layer is formed on the first surface and an inner wall of each the cavities. In addition, an anti-oxidation layer is formed on the plating seed layer, forming a plurality of TSVs in the corresponding cavity. The TSVs include a first end located on the first surface, and a second end opposite to the first end. Next, a redistribution layer is formed on the first surface. The first end of each of the TSVs is connected to the redistribution layer. Next, the substrate is thinned from a back side opposite to the first surface. After thinning the substrate, the substrate will include a second surface opposite to the first surface. The second end of each of the TSVs protrudes from the second surface. A dielectric layer is formed on the second surface and the second end of each of the TSVs.

An embodiment of the disclosure provides a stacking structure of a semiconductor device. The stacking structure includes a substrate, a plurality of semiconductor devices, and a plurality of connecting elements. The semiconductor devices are vertically stacked on the substrate. Each semiconductor device includes a plurality of TSVs and at least one redistribution layer. In addition, the TSVs penetrate through each of the semiconductor devices. The at least one redistribution layer is disposed on a first surface of one of the semiconductor devices. The at least one redistribution layer is connected to the TSVs of the semiconductor device through the first surface. The connecting elements are disposed in the TSVs and between one of the semiconductor devices and the substrate. The TSVs of each of the semiconductor devices are electrically connected to the redistribution layer through the connecting elements.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 2A to FIG. 2M are schematic cross-sectional views illustrating a method of manufacturing a semiconductor device according to an embodiment of the disclosure.

DETAILED DESCRIPTION OF DISCLOSED EMBODIMENTS

Figure 1:
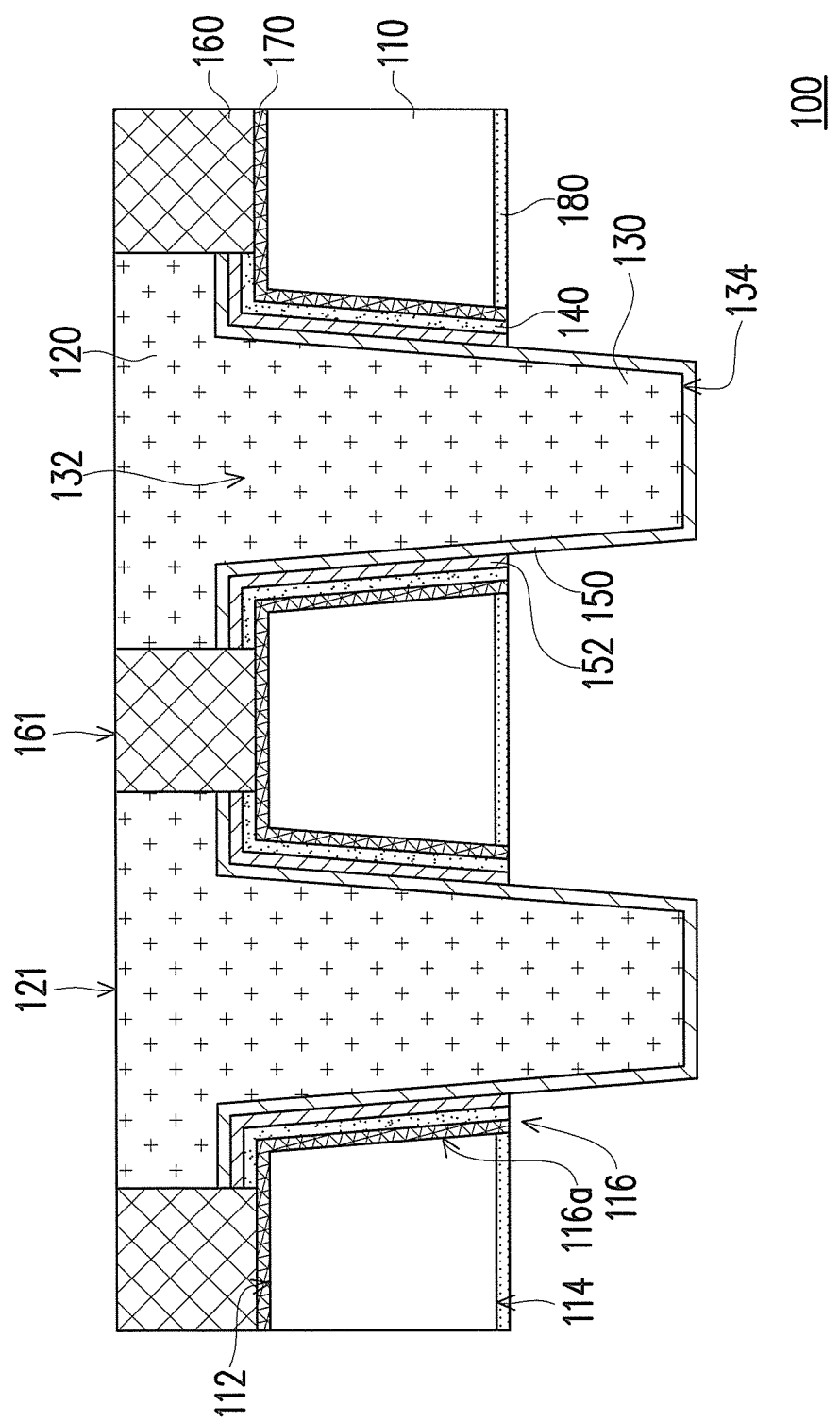
FIG. 1 is a schematic cross-sectional view illustrating a semiconductor device according to an embodiment of the disclosure.

FIG. 1 is a schematic cross-sectional view illustrating a semiconductor device according to an embodiment of the disclosure. Referring to FIG. 1, a semiconductor device 100 includes a substrate 110, a redistribution layer 120, a plurality of through-silicon vias (TSVs) 130, a plating seed layer 140, an anti-oxidation layer 150, and a buffer layer 160. In the embodiment, the substrate 110 includes a first surface 112 and a second surface 114, and a plurality of cavities 116. The cavities 116 respectively connect the first surface 112 and the second surface 114. In addition, the redistribution layer 120 is disposed on the first surface 112. The TSVs 130 are disposed in the corresponding cavity 116, and each of the TSVs 130 respectively has a first end 132 and a second end 134. In the embodiment, the first end 132 of each of the TSVs 130 is connected to the redistribution layer 120. The second end 134 of each of the TSVs 130 protrudes from an outside portion of the second surface 114 of the substrate 110. Furthermore, the plating seed layer 140 is disposed between an inner wall 116a of each cavity 116 and the corresponding TSVs 130. In the embodiment, the plating seed layer 140 includes a titanium copper composite layer, and the titanium copper composite layer further includes a titanium (Ti) layer and a copper (Cu) layer, sequentially disposed on the inner wall 116a of the cavity 116 and the first surface 112. However, the disclosure is not limited thereto. The plating seed layer 140 of the embodiment can also be made up of other suitable metal materials.

The anti-oxidation layer 150 of the embodiment is disposed between the plating seed layer 140 and the corresponding TSVs 130. In addition, the anti-oxidation layer 150 covers the corresponding TSVs 130, including the protruding second ends 134. In the embodiment, the anti-oxidation layer 150 includes a gold (Au) layer; however the disclosure is not limited thereto. In another embodiment of the disclosure that is not shown, the anti-oxidation layer 150 can include other anti-oxidation metal materials such as nickel, palladium (Pd), gold, or tin (Sn) composite metal material layers or other metal layers that can be used for a bonding process of conductive bumps. In addition, in the embodiment, for example, a nickel layer is disposed between the anti-oxidation layer 150 and the plating seed layer 140, so as to serve as an adhesive layer 152 between the anti-oxidation layer 150 and the plating seed layer 140. A buffer layer 160 is disposed on the substrate 110, covering the first surface 112 of the substrate 110, and exposing the redistribution layer 120. The redistribution layer 120 includes a third surface 121, and the buffer layer 160 includes a fourth surface 161. The third surface 121 and the fourth surface 161 are coplanar to each other.

Referring to FIG. 1, in the embodiment, a liner 170 is disposed on the first surface 112 of the substrate 110 and the inner wall 116a. The liner 170 is disposed between the substrate 110 and the plating seed layer 140. In addition, a dielectric layer 180 is disposed on the second surface 114 of the substrate 110, so as to insulate and protect the substrate 110. Furthermore, in another embodiment of the disclosure that is not shown, at least one additional layer structure can be disposed on the third surface 121 of the redistribution layer 120 and the fourth surface 161 of the buffer layer 160, so as to increase the wiring space of the semiconductor device 100. In the semiconductor device 100 of the embodiment, the second ends 134 of the TSVs 130 protruding from the second surface 114 are covered by the anti-oxidation layer 150, or the entire TSVs are completely covered. Furthermore, the second ends 134 of the TSVs 130 can serve as conductive bumps that electrically connect with other semiconductor devices or external devices. The semiconductor device 100 of the embodiment directly has the second ends 134 of the TSVs 130 serve as conductive bumps. Thus, in contrast to general conductive bumps of semiconductor devices, the conductive bumps of the embodiment not only have a more level and smooth outer surface, the conductive bump also has smaller dimensions. In addition, gaps between the conductive bumps are smaller. Furtheimore, the semiconductor device 100 of the embodiment is suitable to be used in a stacked structure of a three dimensional integrated circuit, and can further reduce the overall volume of a three dimensional integrated circuit. This achieves the effects of the microminiaturization design of electronic devices.

Figure 2A:
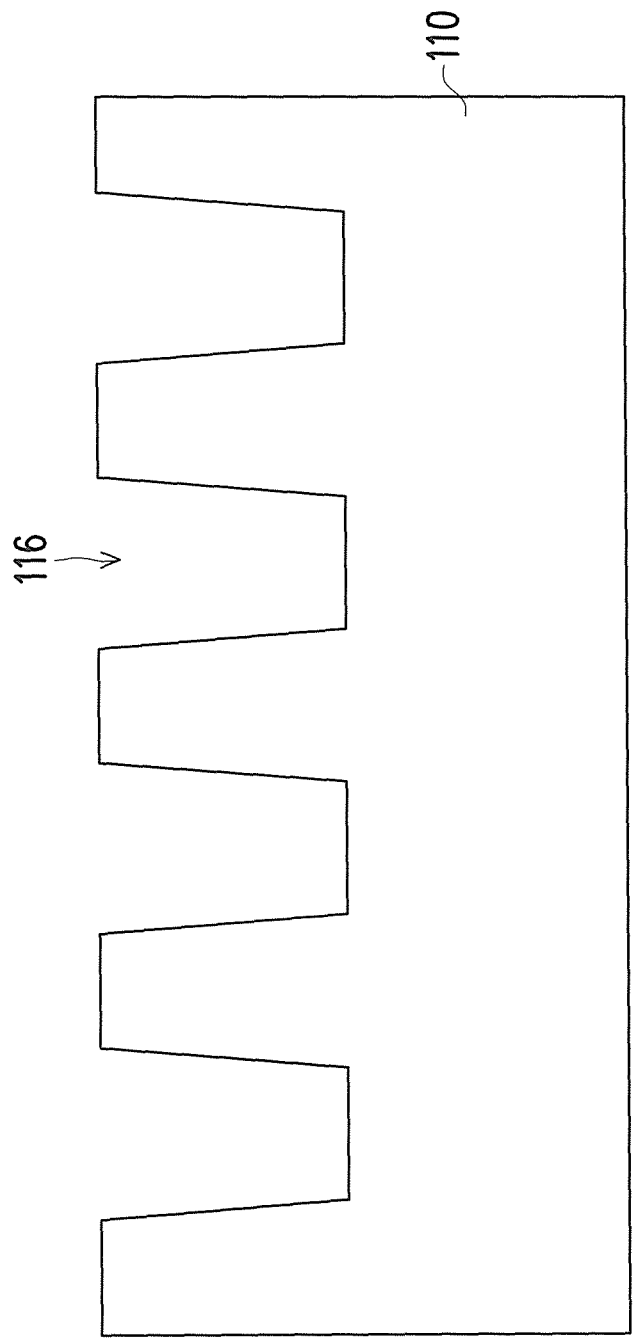
Figure 2B:
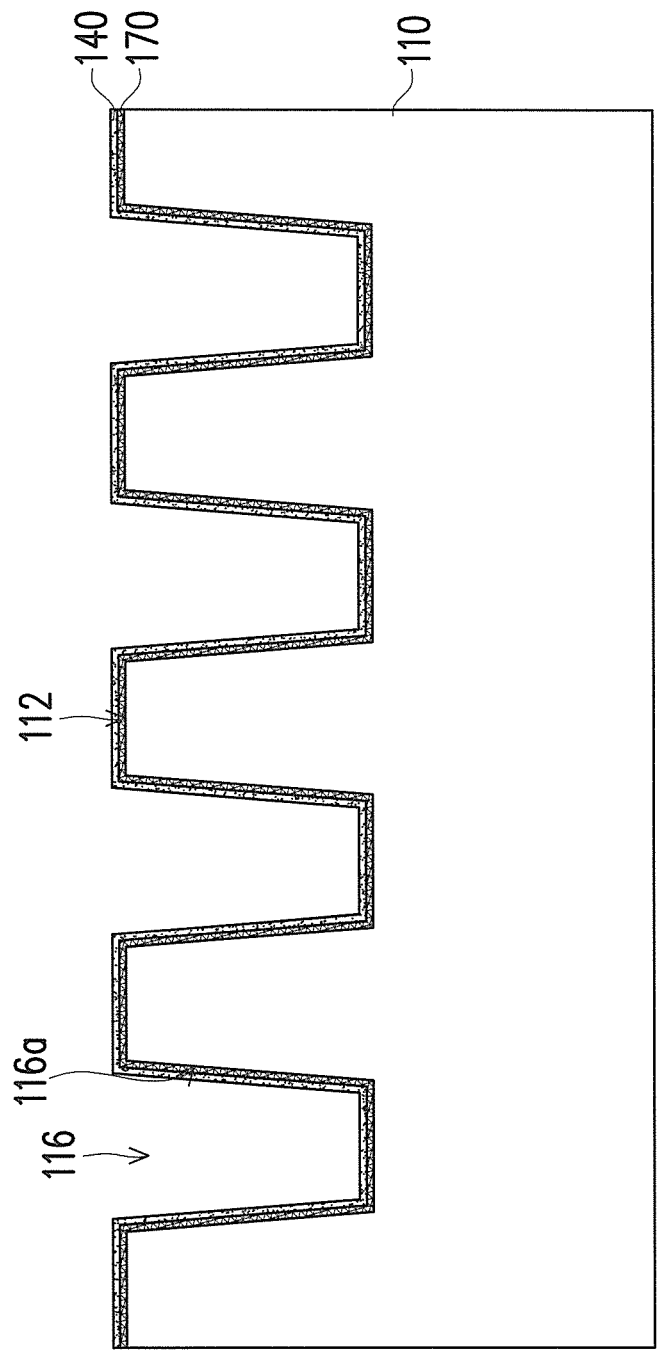
Figure 2C:
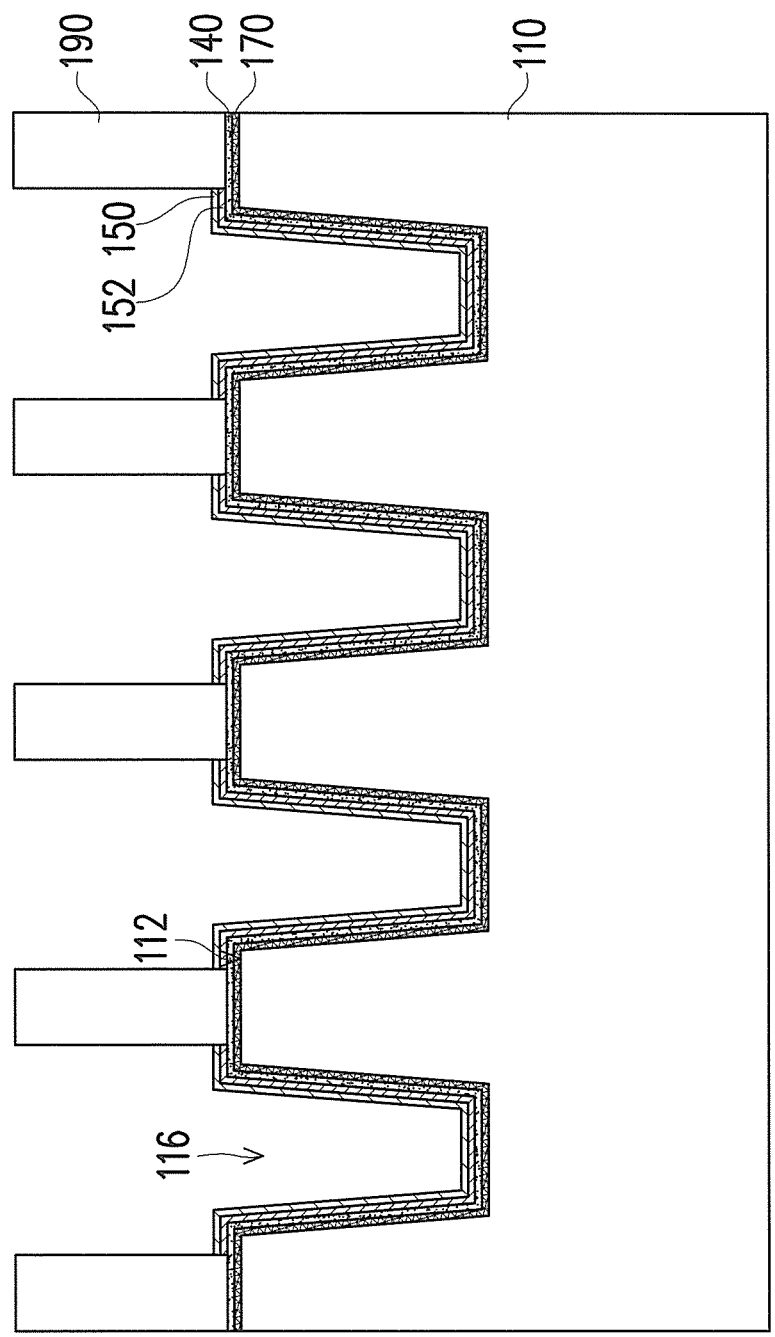
Figure 2D:
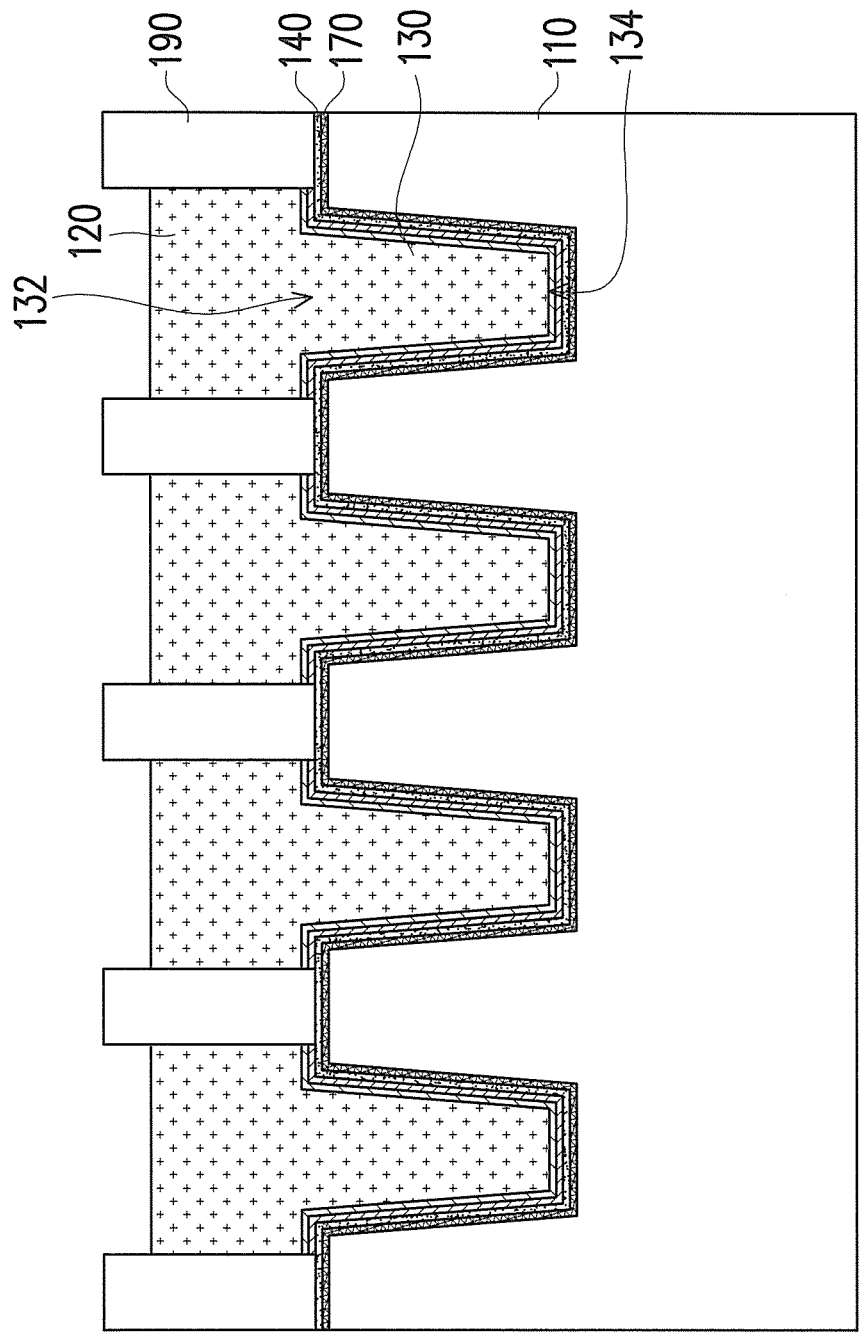
Figure 2E:
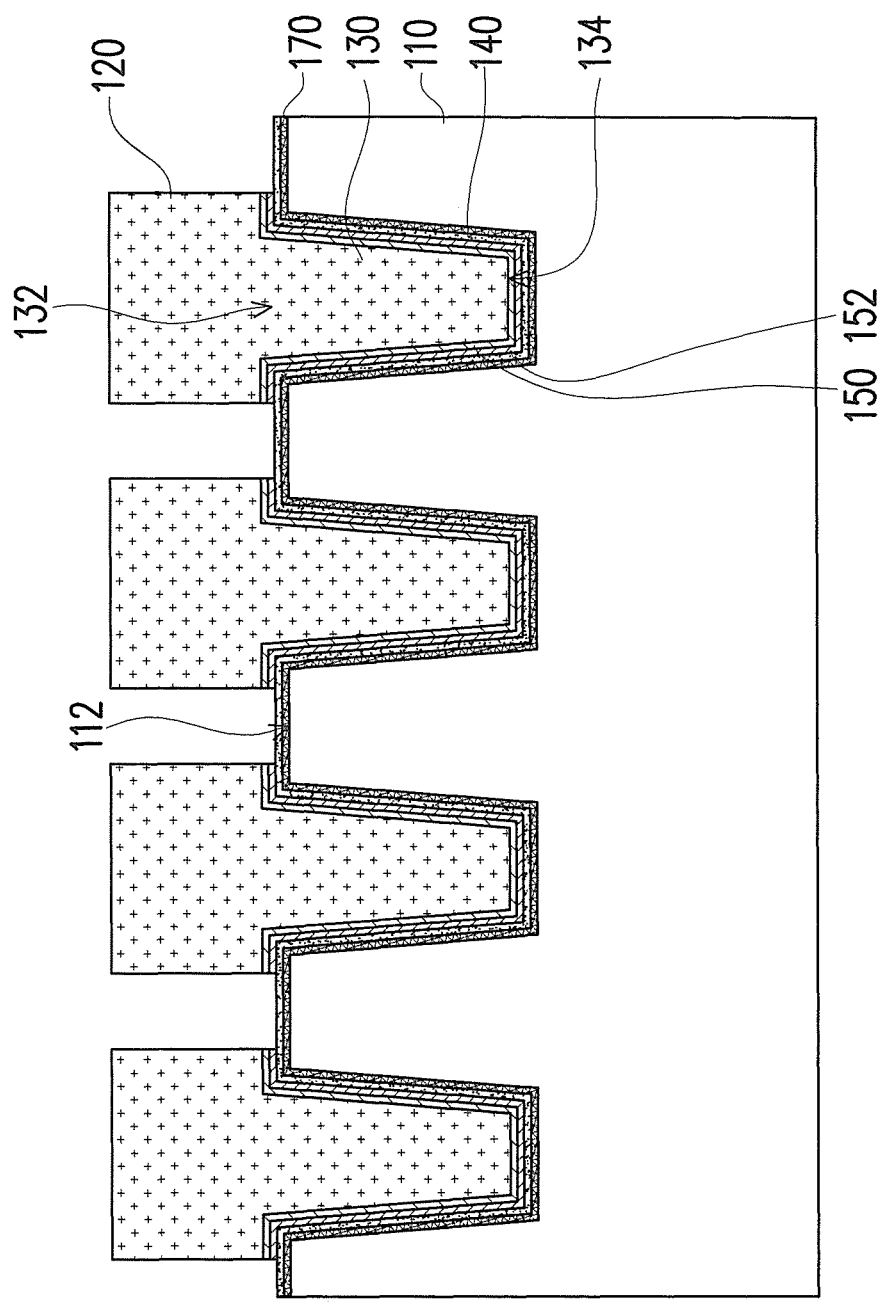

FIG. 2A to FIG. 2M are schematic cross-sectional views illustrating a method of manufacturing a semiconductor device according to an embodiment of the disclosure. Referring to FIG. 2A, in the embodiment, first, a substrate 110 with a plurality of cavities 116 is provided. In the embodiment, the substrate 110 can be, for example, made up of a silicon chip or a chip with silicon material. The substrate 110 can be applied as an inner substrate of a semiconductor device stacking structure. Referring to FIG. 2B, the embodiment can, beforehand, form a liner 170 on a first surface 112 of the substrate 110 and on an inner wall 116a of the cavities 116. Next, a sputtering method, for example, is used to form a plating seed layer 140 on the first surface 112 of the substrate 110 and the inner walls 116a. In the embodiment, the plating seed layer 140 includes a titanium copper composite layer, and the titanium copper composite layer further includes a titanium layer and a copper layer, sequentially sputtered on the inner walls 116a and the first surface 112. In addition, referring to FIG. 2C, a patterned photoresist layer 190 is deposited on the first surface 112 of the substrate 110. Next, through an electroless electroplating method, a gold layer is electroplated on the plating seed layer 140, to serve as an anti-oxidation layer 150. In the embodiment, an adhesive layer 152 that is, for example, a nickel layer, can be further disposed between the plating seed layer 140 and the anti-oxidation layer 150. Furthermore, referring to FIG. 2D and FIG. 2E, in the embodiment, the conductive copper pillars of the TSVs 130 and the redistribution layer 120 above the conductive copper pillars are formed through an electroplating method. Then, the patterned photoresist layer 190 is removed from the first surface 112.

Figure 2F:
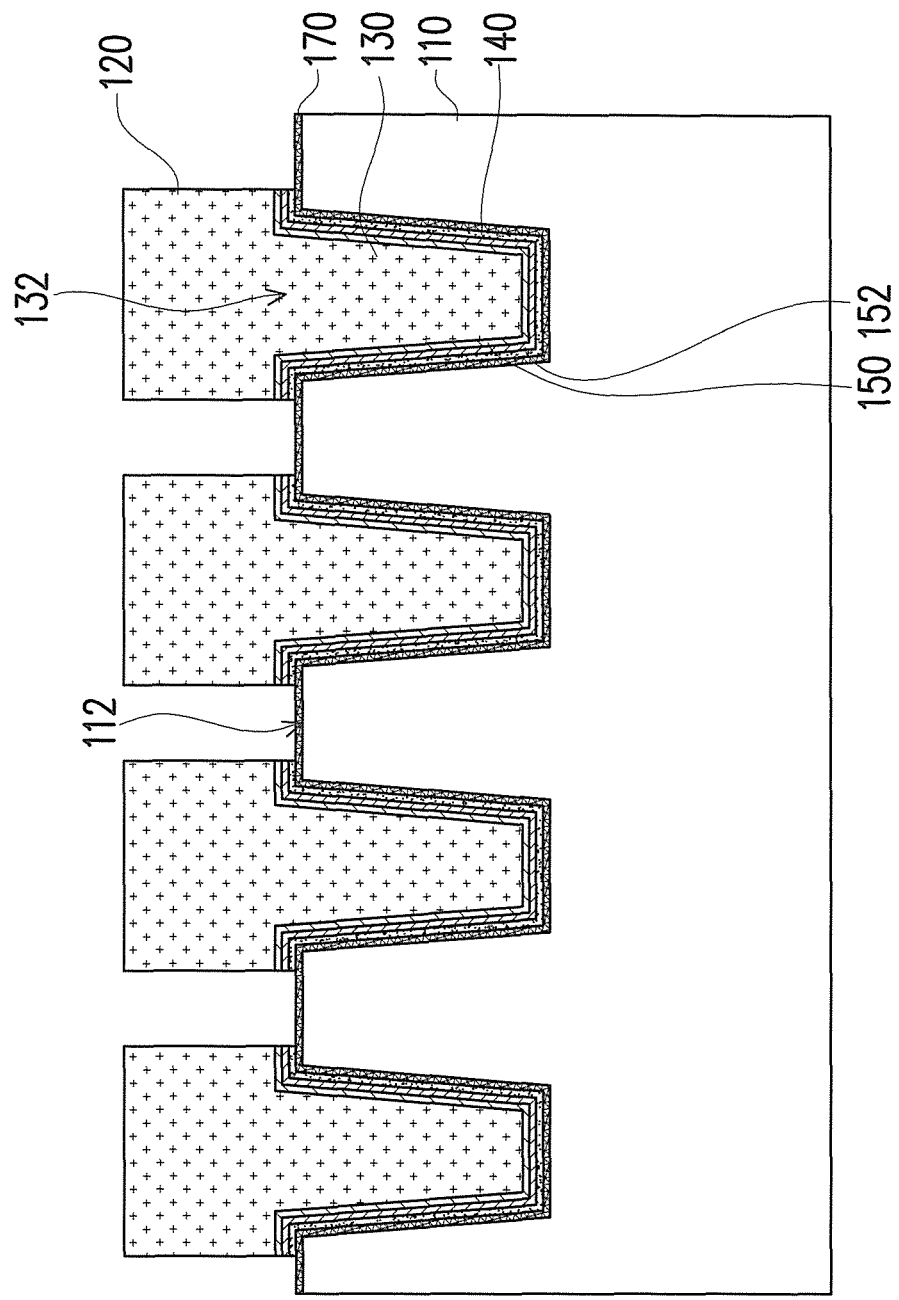
Figure 2G:
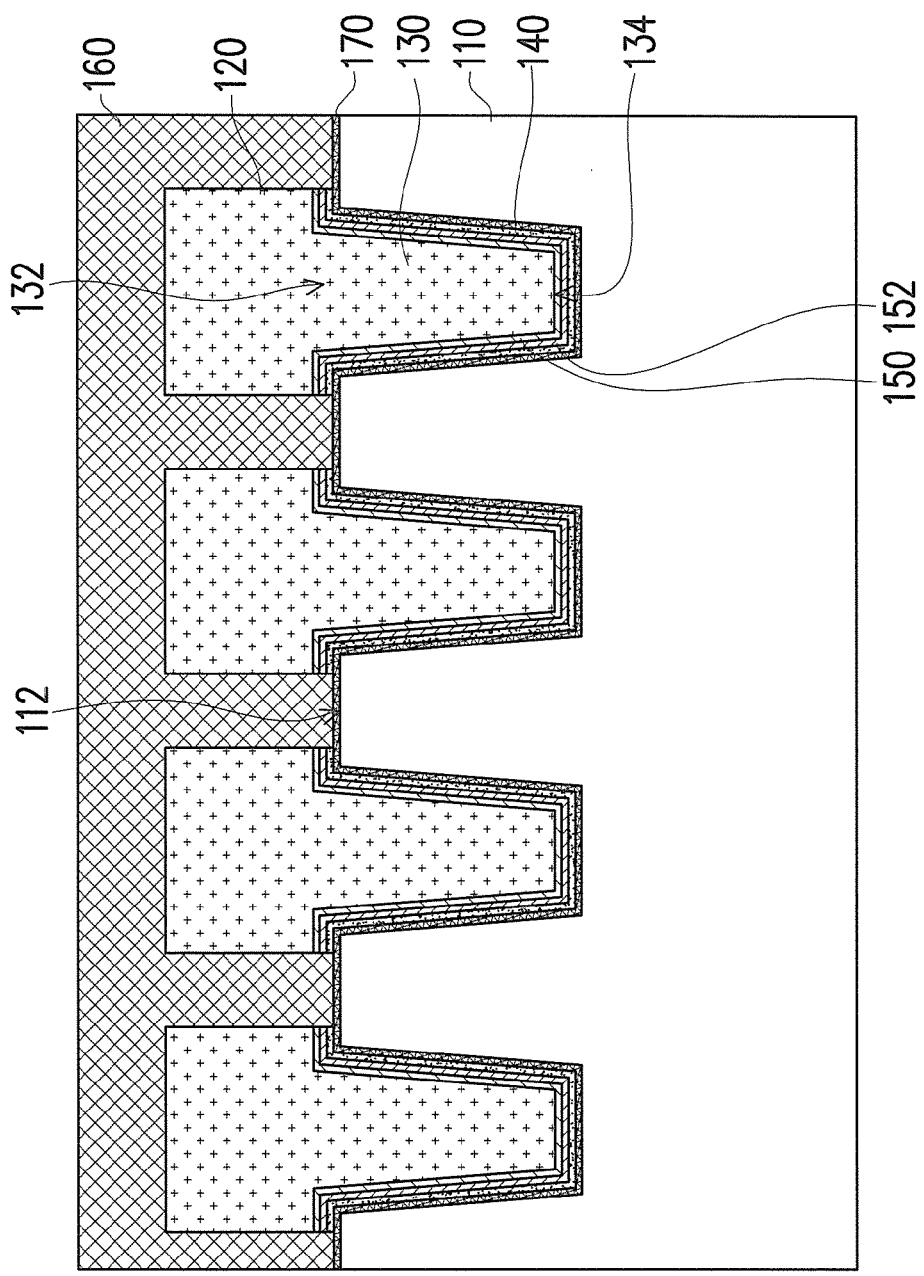
Figure 2H:
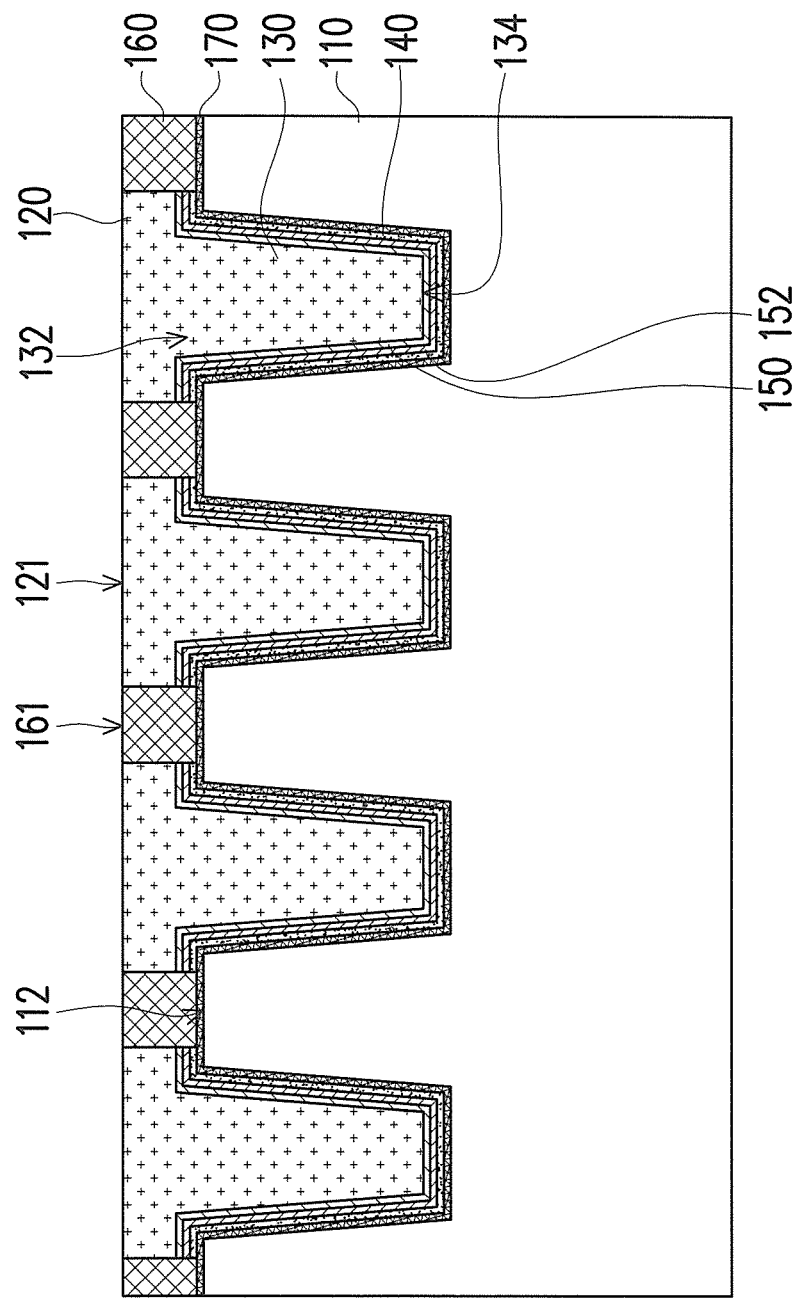
Figure 2I:
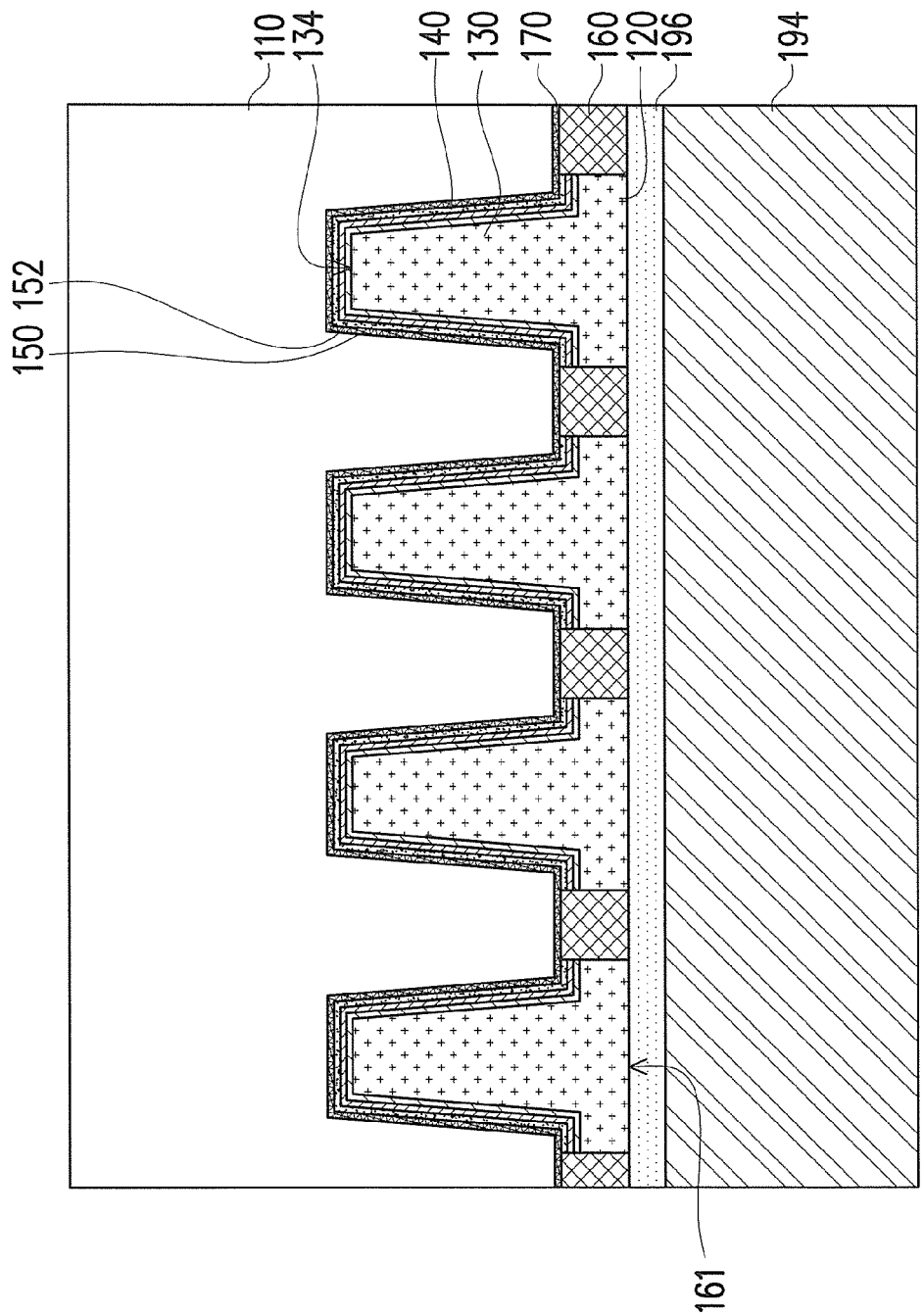

On the other hand, referring to FIG. 2F, after removing the patterned photoresist layer 190, the portion of the plating seed layer 140 on the first surface 112 and not covered by the redistribution layer 120 is removed through, for example, wet etching. After that, referring to FIG. 2G, a buffer layer 160 covering the first surface 112 and the redistribution layer 120 is formed on the substrate 110. In the embodiment, a material of the buffer layer 160 is an insulating protecting material such as polybenzoxazole (PBO). In addition, referring to FIG. 2H, in the embodiment, a portion of the buffer layer 160 and a portion of the redistribution layer 120 can be removed through, for example, a mechanical polishing method. A third surface 121 and a fourth surface 161 are then respectively formed on the redistribution layer 120 and the buffer layer 160. The third surface 121 and the fourth surface 161 are coplanar to each other. Next, referring to FIG. 2I, the semiconductor device 100 is adhered onto a carrier 194 through both the third surface 121 and the fourth surface 161 at the same time, so as to perform subsequent thinning process of the back side of the substrate 110. In the embodiment, a detachable film 196 is further disposed between the carrier 194 and the third surface 121, and the carrier 194 and the fourth surface 161. This way, the carrier 194 can be subsequently removed through the detachable film 196 from the third surface 121 and the fourth surface 161 of the semiconductor device 100. In the embodiment, because of the configuration of the detachable film 196, a more complicated etching process is not required, and so the overall manufacture of the semiconductor device 100 is simplified, and manufacturing cost is saved.

Figure 2K:
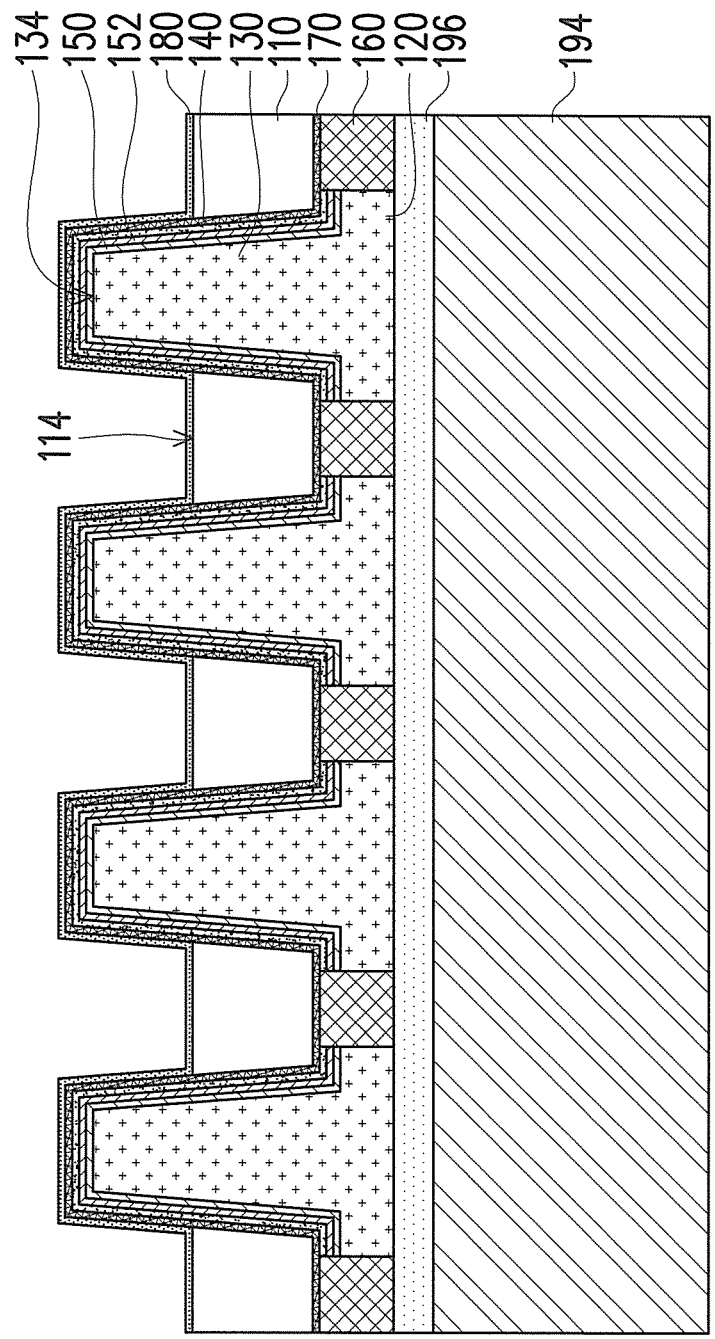
Figure 2L:
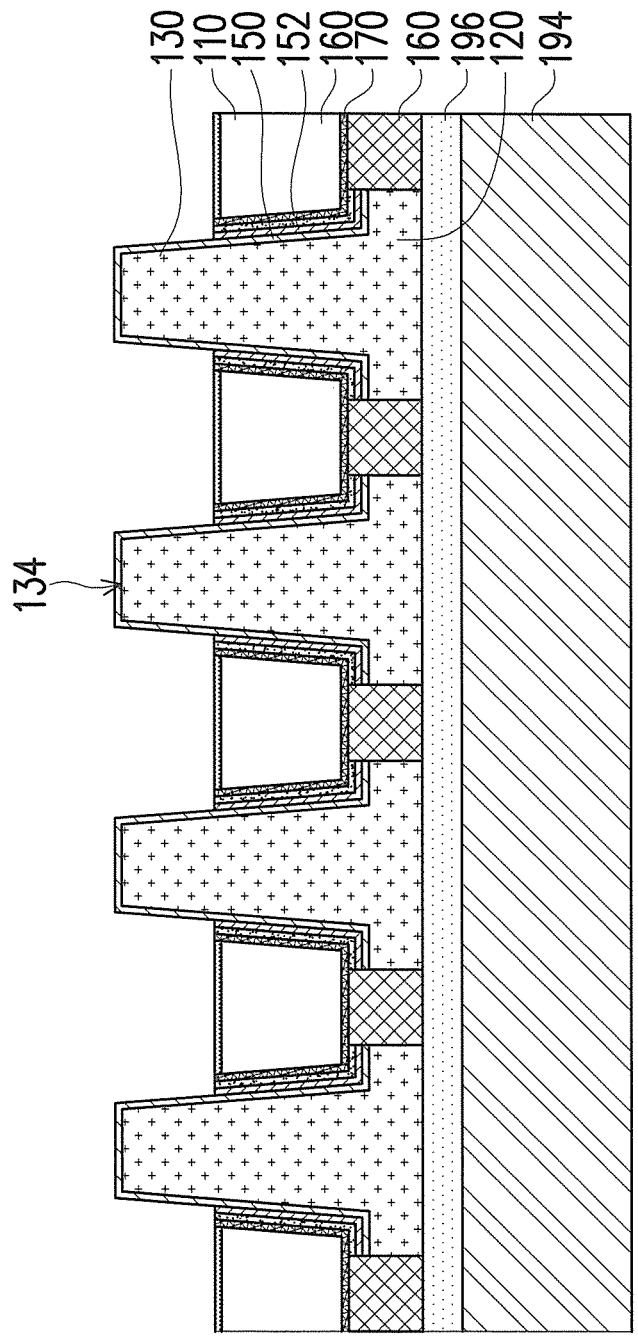
Figure 2M:
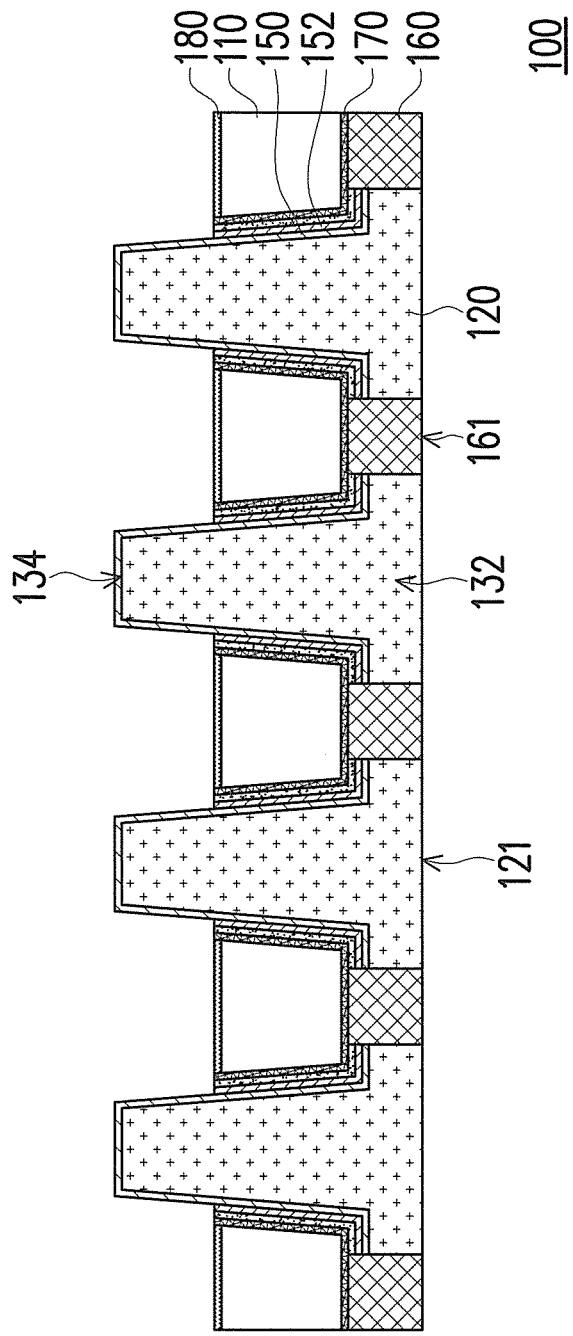

In the embodiment, referring to FIG. 2J, the substrate 110 can be thinned through grinding, chemical mechanical polarization, and dry etching processes. By thinning the substrate 110 from the back side opposite to the first surface 112, a second surface 114 is formed. The second end 134 of the TSVs 130 protrude from the second surface 114, so as to form a plurality of micro bumps protruding from the second surface 114. In addition, as seen in FIG. 2K, a dielectric layer 180 is formed on the surface of the formed micro bumps and the second surface 114 of the substrate 110, so as to insulate and protect the second surface 114 of the substrate 110. Next, referring to FIG. 2L, in the embodiment, a chemical mechanical polarization process is used to remove the portions of the liner 170 and the dielectric layer 180 on the micro bumps. In addition, a wet etching process is used to remove the portion of the plating seed layer 140 and the adhesive layer 152 on the micro bumps. This way, a plurality of second ends 134 of the TSVs 130 covered by the anti-oxidation layer 150 are exposed, so as to serve as the micro bumps. Finally, as seen in FIG. 2M, the carrier 194 is removed, completing the manufacture of the semiconductor device 100. In the embodiment, by utilizing the single electroplating step of electroplating the TSVs 130, the redistribution layer 120, the TSVs 130, and micro bumps are simultaneously manufactured. In detail, the embodiment simultaneously forms the redistribution layer 120 and the conductive copper pillars of the TSVs 130 through a single step of the electroplating process. In addition, by thinning the substrate 110, the second end 134 of the TSVs 130 are exposed by the second surface 114 of the thinner substrate 110, so as to serve as micro bumps electrically connected to external devices. Thus, in contrast to general conductive bumps of semiconductor devices, the micro bumps formed by the manufacturing method have a more level and smooth outer surface, and also have smaller dimensions. This improves the overall smoothness of the substrate 110, and reduces gaps between the micro bumps. Further, the anti-oxidation layer 150 deposed in the cavities 116 can protect the conductive copper pillars of the TSVs 130. Therefore, the manufacturing method of the embodiment can effectively simplify the overall manufacturing process of the semiconductor device 100, and further reduce manufacturing cost of the semiconductor device 100.

Figure 3A:
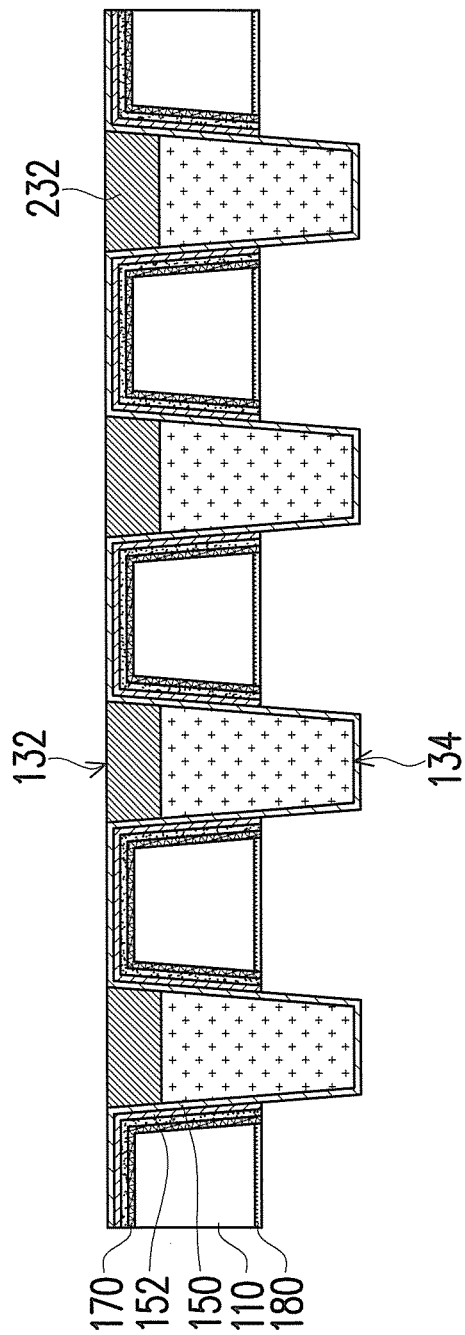
FIG. 3A is a schematic cross-sectional view illustrating a semiconductor device according to another embodiment of the disclosure.
Figure 3B:
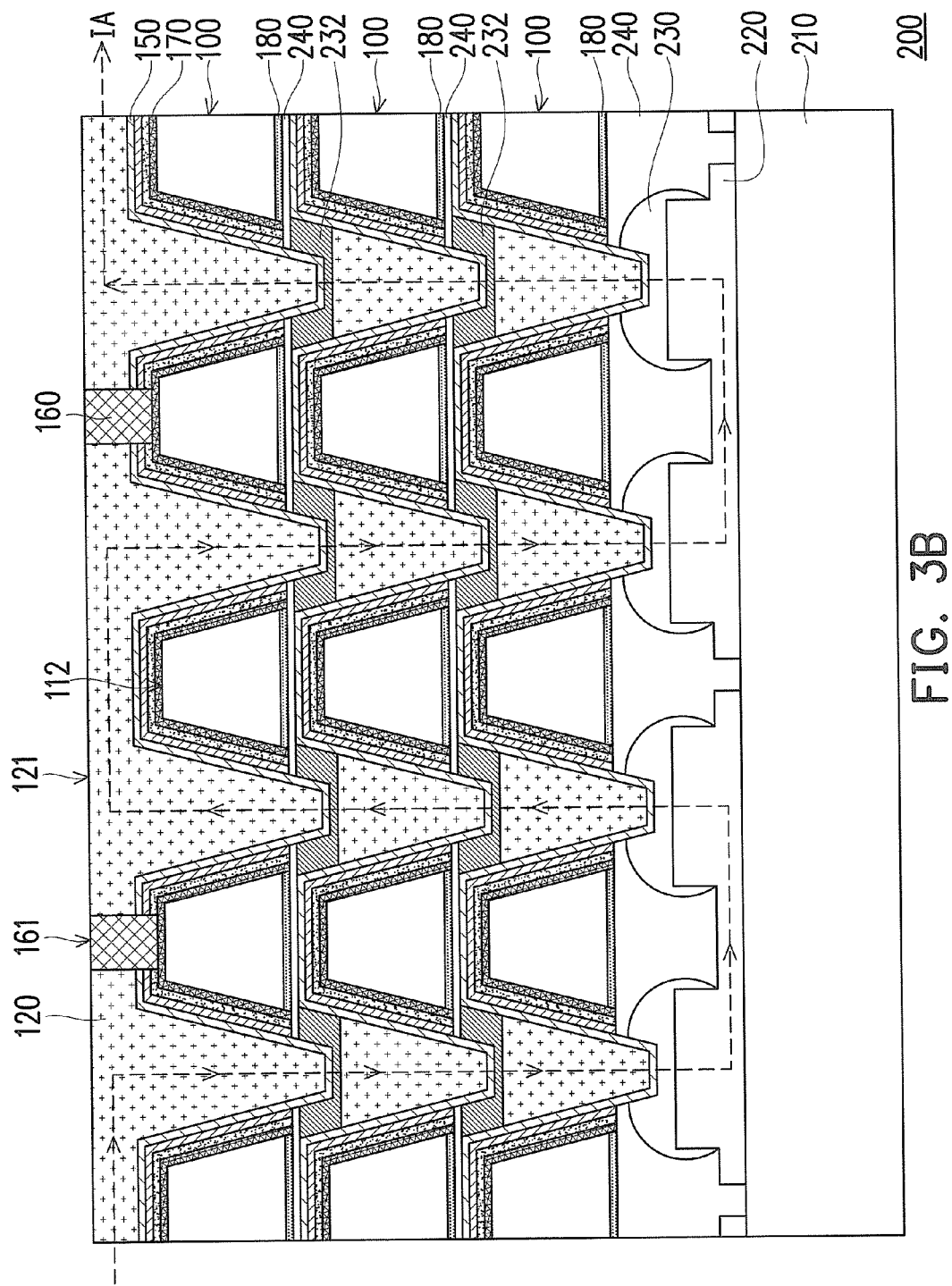
FIG. 3B is a schematic cross-sectional view of a stacking structure of the semiconductor device depicted in FIG. 3A.

FIG. 3A is a schematic cross-sectional view illustrating a semiconductor device according to another embodiment of the disclosure. In the embodiment, same or similar elements in the previous embodiment are represented with the same reference numbers. Accordingly, no repeated descriptions are provided hereinafter. Referring to FIG. 3A, in the embodiment, the second ends 134 of the TSVs 130 of the semiconductor device 100 respectively include connecting elements 232 so as to electrically connect a plurality of semiconductor devices 100 or to electrically connect a semiconductor device 100 and a substrate or another external device. In the embodiment, the connecting element can be, for example, completely or partially made up of a solder tin layer or other suitable metals used for connecting. In addition, FIG. 3B is a schematic cross-sectional view of a stacking structure of the semiconductor device depicted in FIG. 3A. Referring to FIG. 3B, a semiconductor device stacking structure 200 includes a substrate 210, a plurality of semiconductor devices 100, at least one redistribution layer 120, and a plurality of connecting elements 230, 232. In the embodiment, the semiconductor devices 100 are vertically stacked on each other on the substrate 210. In another embodiment that is not shown, the semiconductor device stacking structure 200 can also be made up of different semiconductor devices such as, dynamic random access memories (DRAM), flash memories, or logic devices. In addition, as described in previous embodiments, each of the semiconductor devices 100 respectively include a plurality of TSVs 130 penetrating through the semiconductor devices 100. Furthermore, in the embodiment, at least one redistribution layer 120 and a buffer layer 160 are disposed on the first surface 112 of the semiconductor device 100 located on the top layer of the semiconductor device stacking structure 200. In addition, the redistribution layer 120 includes a third surface 121, and the buffer layer 160 includes a fourth surface 161. The third surface 121 and the fourth surface 161 are coplanar to each other. On the other hand, a plurality of connecting elements 230, 232 are respectively disposed in the TSVs 130 and between one of the semiconductor devices 100 and the substrate 210. In the stacking structure 200 of the embodiment, the connecting elements 230, 232 are, for example, a plurality of solder balls and solder tin layers. Thus, the connecting elements 230, 232 electrically connect the TSVs 130 of the semiconductor devices 100 and the redistribution layer 120.

Referring to FIG. 3B, in the embodiment, a plurality of insulating layers 240 are further disposed between the semiconductor devices 100, and between the substrate 210 and the semiconductor device 100 on the bottom layer of the semiconductor device stacking structure 200. In the embodiment, a material of the insulating layer 240 is, for example, benzocyclobutene (BCB). On the other hand, the substrate 210 of the embodiment is made up by materials such as a silicon substrate or a glass substrate. A plurality of conductive bumps 220, such as copper bumps, can be disposed on the substrate 210. In detail, in the embodiment, the semiconductor devices 100 vertically stacked on each other are electrically connected through connecting elements 230, 232 that are, for example, solder balls, solder tin, or other solder materials. This allows a current IA to be transmitted between the vertically stacked semiconductor devices 100 through the TSVs 130 and the conductive bumps 220. Therefore, through the semiconductor device stacking structure 200 of the embodiment, the length of conductive wiring between the semiconductor devices 100 can be effectively reduced. This way, the overall volume of a semiconductor apparatus can be reduced, further improving the overall operation speed of a device.

Based on the above, the semiconductor device includes a top layer of metal wiring, a bottom layer of micro bumps, and TSVs in the middle. In the method of manufacturing the semiconductor device of the disclosure, a single step in the electroplating process can simultaneously form a redistribution layer, through-silicon vias, and micro bumps of the semiconductor device. In addition, in contrast to the conventional photolithographic processes of semiconductor devices, the method of manufacturing the semiconductor device of the disclosure uses one photomask process. Also, during the process of plating the TSVs, the anti-oxidation layer for conducting the micro bumps is formed. Therefore, the manufacturing method of the disclosure can greatly decrease cost of plating and masking. In addition, in the process of thinning the substrate of the disclosure, an etching technology may be used, exposing a bottom portion of the TSVs, so as to serve as a conductive bump directly contacted with the chip or substrate. This effectively reduces the dimensions and gaps of the conductive bumps, so that the semiconductor device of the disclosure can be applied on miniaturized circuit layouts.

To sum up, the disclosure discloses a semiconductor device, a method of manufacturing, and a stacking structure thereof. The semiconductor device stacking structure of the disclosure includes a redistribution layer on the top layer, micro bumps on the bottom layer, and TSVs in the middle. In addition, the disclosure utilizes a single electroplating step of the TSVs to simultaneously complete the manufacture of the redistribution layer, the TSVs, and the micro bumps. This greatly reduces the cost and number of electroplating processes. In addition, when the micro bumps of the disclosure are in the electroplating process of the TSVs, the anti-oxidation layer of the conductive copper pillars of the TSVs is completed. In addition, in the method of manufacturing the semiconductor device of the disclosure, at least two photolithographic processes that were originally required conventionally can be simplified into one. In the disclosure, the aforementioned method of manufacture has integration and improvement processes, and the dimensions of and gap distance between the conductive bumps of the semiconductor device are greatly reduced. Thus, the structure of the semiconductor device and the method of manufacture of the disclosure satisfy the current developmental trend of miniaturizing electronic devices and products, and can further reduce the manufacturing cost of semiconductor devices and three dimensional stacking structures thereof.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A semiconductor device, comprising:
    a substrate, comprising a first surface, a second surface opposite to the first surface, and a plurality of through holes, wherein the through holes respectively connect the first surface and the second surface;
    a redistribution layer, disposed on the first surface;
    a plurality of through-silicon vias, disposed in the through holes, and each of the through-silicon vias respectively including a first end and a second end opposite to each other, wherein the first end of each through-silicon via is connected to the redistribution layer, and the second end of each through-silicon via protrudes from the second surface;
    a plating seed layer, disposed between an inner wall of each of the through holes and the corresponding through-silicon vias;
    an anti-oxidation layer, disposed between the plating seed layer and the corresponding through-silicon vias, and a portion of the anti-oxidation layer covers the second ends of the corresponding through-silicon vias; and
    a buffer layer, disposed on the substrate, covering the first surface, and exposing the redistribution layer.

2. The semiconductor device as claimed in claim 1, wherein the plating seed layer comprises a titanium copper composite layer, and the titanium copper composite layer comprises a titanium layer and a copper layer.

3. The semiconductor device as claimed in claim 1, wherein the anti-oxidation layer comprises a gold layer.

4. The semiconductor device as claimed in claim 1, further comprising an adhesive layer, disposed between the anti-oxidation layer and the plating seed layer, wherein the adhesive layer is a nickel layer.

5. The semiconductor device as claimed in claim 1, further comprising a dielectric layer, disposed on the second surface and the second end of each of the through-silicon vias.

6. The semiconductor device as claimed in claim 1, wherein the redistribution layer includes a third surface, and the buffer layer includes a fourth surface, wherein the third surface and the fourth surface are exposed and coplanar to each other.

7. A semiconductor device stacking structure, comprising:
    a substrate;
    a plurality of a semiconductor devices, vertically stacked on the substrate, wherein each of the semiconductor devices includes a plurality of through-silicon vias, penetrating through each of the semiconductor devices, and each of the through-silicon vias has a first end and a second end opposite to each other;
    at least one redistribution layer, disposed on a first surface of one of the semiconductor devices, wherein the at least one redistribution layer is connected to the through-silicon vias of the one of the semiconductor device through the first surface; and
    a plurality of connecting elements, buried in the through-silicon vias and disposed between one of the semiconductor devices and the substrate, wherein the second ends of the through-silicon vias of each of the semiconductor devices are respectively inserted into the connecting elements, and the through-silicon vias are electrically connected to the at least one redistribution layer through the connecting elements.

8. The semiconductor device stacking structure as claimed in claim 7, wherein the connecting elements comprise a plurality of solder balls and solder tin layers.

9. The semiconductor device stacking structure as claimed in claim 7, further comprising a plurality of dielectric layers respectively disposed between each of the semiconductor devices.

10. The semiconductor device stacking structure as claimed in claim 7, further comprising an insulating layer disposed between the substrate and the semiconductor devices.

11. The semiconductor device stacking structure as claimed in claim 7, wherein the substrate is a silicon substrate, and the substrate includes a plurality of conductive bumps disposed on the substrate.

* * * * *